US011917919B2

United States Patent
Matsushita et al.

(10) Patent No.: US 11,917,919 B2
(45) Date of Patent: *Feb. 27, 2024

(54) ELECTRET

(71) Applicants: DENSO CORPORATION, Kariya (JP); TOKYO UNIVERSITY OF SCIENCE FOUNDATION, Tokyo (JP)

(72) Inventors: Noriyuki Matsushita, Kariya (JP); Yoshihiro Kozawa, Kariya (JP); Kazuhiko Kanoh, Kariya (JP); Yumi Tanaka, Tokyo (JP)

(73) Assignees: DENSO CORPORATION, Kariya (JP); TOKYO UNIVERSITY OF SCIENCE FOUNDATION, Tokyo (JP)

( * ) Notice: Subject to any disclaimer, the term of this patent is extended or adjusted under 35 U.S.C. 154(b) by 614 days.

This patent is subject to a terminal disclaimer.

(21) Appl. No.: 17/116,099

(22) Filed: Dec. 9, 2020

(65) Prior Publication Data
US 2021/0184100 A1 Jun. 17, 2021

(30) Foreign Application Priority Data

Dec. 13, 2019 (JP) .................. 2019-225735
Sep. 30, 2020 (JP) .................. 2020-164898

(51) Int. Cl.
*H10N 30/85* (2023.01)
*H10N 30/30* (2023.01)
(Continued)

(52) U.S. Cl.
CPC ........... *H10N 30/852* (2023.02); *H01G 7/025* (2013.01); *H01G 7/026* (2013.01); *H01G 7/06* (2013.01);
(Continued)

(58) Field of Classification Search
CPC ........ H01G 7/025; H01G 7/021; H01G 7/026; H01G 7/028; C01B 25/32; C01F 17/34;
(Continued)

(56) References Cited

U.S. PATENT DOCUMENTS

2002/0190434 A1 12/2002 Eitzman et al.
2004/0023577 A1 2/2004 Horiguchi et al.
(Continued)

FOREIGN PATENT DOCUMENTS

JP 2016-160114 A 9/2016
JP 2017-162906 A 9/2017
(Continued)

OTHER PUBLICATIONS

M. Fabian et al., 'Ionic and electronic transport in calcium- substituted LaAlO3 perovskites prepared via mechanochemical route,' Journal of the European Ceramic 2019 39(16), 5298-5308 (Jul. 31, 2019).
S. Lisitsina et al., 'The role of structural point defects in the type formation of electret state in perovskite-type oxides,' Journal of Electrostatics V 24(3), 295-300 (Mar. 31, 1990).
(Continued)

*Primary Examiner* — Andrew J. Oyer
(74) *Attorney, Agent, or Firm* — POSZ LAW GROUP, PLC

(57) ABSTRACT

An electret includes a substrate and an electret layer formed above a surface of the substrate. The electret layer is a composite metal compound containing two or more different metal elements, and is obtained by subjecting a thin film mainly composed of an inorganic dielectric material having a bandgap energy of 4 eV or more to a polarization treatment.

9 Claims, 3 Drawing Sheets

(51) Int. Cl.
    *H10N 30/853*    (2023.01)
    *H10N 30/50*     (2023.01)
    *H01G 7/06*      (2006.01)
    *H01G 7/02*      (2006.01)
    *H10N 30/045*    (2023.01)

(52) U.S. Cl.
    CPC .............. *H10N 30/30* (2023.02); *H10N 30/50* (2023.02); *H10N 30/853* (2023.02); *H10N 30/045* (2023.02)

(58) Field of Classification Search
    CPC .............. C01P 2002/34; C01P 2006/40; C01P 2002/54; C01P 2004/61
    See application file for complete search history.

(56)         References Cited

U.S. PATENT DOCUMENTS

| 2010/0127595 | A1  | 5/2010 | Suzuki et al. |             |
|--------------|-----|--------|---------------|-------------|
| 2021/0183584 | A1* | 6/2021 | Matsushita    | C01B 25/32  |
| 2021/0184100 | A1* | 6/2021 | Matsushita    | H01G 7/025  |

FOREIGN PATENT DOCUMENTS

| JP | 6465377    | B2 | 2/2019 |
|----|------------|----|--------|
| WO | 2000/000267 | A2 | 1/2000 |

OTHER PUBLICATIONS

U.S. Appl. No. 17/116,217, filed Dec. 9, 2020, Kozawa et al.
U.S. Appl. No. 17/116,204, filed Dec. 9, 2020, Matsushita et al.

* cited by examiner

ELECTRET

CROSS REFERENCE TO RELATED APPLICATIONS

The present application claims the benefit of priority from Japanese Patent Application No. 2019-225735 filed on Dec. 13, 2019 and Japanese Patent Application No. 2020-164898 filed on Sep. 30, 2020. The entire disclosures of all of the above applications are incorporated herein by reference.

TECHNICAL FIELD

The present disclosure relates to an electret.

BACKGROUND

As an energy harvesting technology that converts energy existing in the environment into electric power, practical application of a vibration power generation element or the like using an electret has been studied.

SUMMARY

An electret according to one aspect of the present disclosure includes a substrate and an electret layer formed above a surface of the substrate. The electret layer is a composite metal compound containing two or more different metal elements and is obtained by subjecting a thin film mainly composed of an inorganic dielectric material having a handclap energy of 4 eV or more to a polarization treatment.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
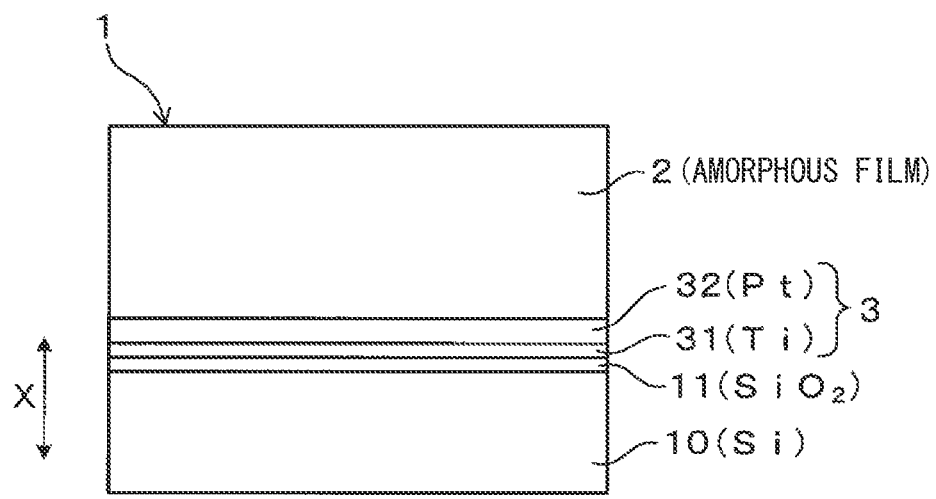
FIG. 1 is a schematic view showing a schematic configuration example of an electret according to a first embodiment.

As a constituent material of the electret, for example, an organic polymer material such as a fluororesin is generally used. While the organic polymer material has advantages such as shape freedom and excellent controllability of film thickness in thin film formation, there are concerns about a thermal stability of a surface potential and a deterioration of performance over time in a high temperature environment because of being an organic matter.

On the other hand, it has been studied to form an electret using an inorganic compound material having excellent stability at high temperatures. For example, an electret material may use a sintered body having a crystal structure of hexagonal hydroxyapatite and having a hydroxide ion content lower than that of hydroxyapatite having a stoichiometric composition. This sintered body is obtained by sintering and dehydrating a molded product made from hydroxyapatite powder at a high temperature of higher than 1250° C. and lower than 1500° C. and it is considered that a high surface potential is expressed after a polarization treatment due to defects of hydroxide ions.

By incorporating a power generation element or the like using an inorganic electret into an integrated circuit or the like formed on a substrate, a power generation device can be miniaturized and used in a high temperature environment, and is expected to be applied to various uses. However, the electret material described above is a bulk sintered body using a powder raw material, and for example, it is difficult to make a thin film of 0.1 mm or less, so that it is difficult to apply the electric material to a substrate of a device. Alternatively, if a method of sintering the electric material on a substrate is adopted, a processing temperature becomes a high temperature exceeding 1000° C. Thus, the electric material may peel off due to the difference in the coefficient of thermal expansion with the substrate or other films on the substrate.

Further, in a Si process, which is a general method for forming a device, various elements are built on a substrate to form a circuit connected by metal wiring or the like. Therefore, when the processing temperature exceeds 1000° C., damage to the wiring or the like is also inevitable. Moreover, since the processing temperature approaches the melting point of Si or glass which is generally used as a substrate, it is hard to say that using a sintered body is a realistic method.

An electret according to one aspect of the present disclosure includes a substrate and an electret layer formed above a surface of the substrate. The electret layer is a composite metal compound containing two or more different metal elements and is obtained by subjecting a thin film mainly composed of an inorganic dielectric material having a bandgap energy of 4 eV or more to a polarization treatment.

The electret having the above configuration can control the bandgap energy, defects, and the like by using the inorganic dielectric material containing two or more metal elements, and can increase the dielectric breakdown voltage by having a high bandgap energy of 4 eV or more. Therefore, by applying a high voltage, for example, at 100° C. or higher in the polarization treatment, a high surface potential can be obtained, and the surface potential is less likely to decrease in a high temperature environment and a long-term use. Further, since the thin-film electret layer is formed above the substrate and can be generally formed by a film forming process of 1000° C. or lower, the electret can be applied to a device while suppressing peeling off of a layer and influence on wiring on the substrate.

As described above, according to the above aspect, it is possible to provide the thin-film electret that can be formed without using a high temperature process exceeding 1000° C. and exhibits stable characteristics in a usage environment.

First Embodiment

An electret according to a first embodiment will be described with reference to FIGS. 1 and 2. As shown in FIG. 1, the electret 1 of the present embodiment has a substrate 10 and an electret layer 2 formed above a surface of the substrate 10. The electret layer 2 is a composite metal compound containing two or more different metal elements, and is obtained by subjecting a thin film mainly composed of an inorganic dielectric material having a bandgap energy of 4 eV or more to a polarization treatment. Here, the term "mainly composed of an inorganic dielectric material" means that particles may be composed only of the inorganic dielectric material, particles may contain impurities due to the raw material of the inorganic dielectric material, or some other components may be added to the inorganic dielectric material during a process of making the inorganic dielectric material into the a film.

The electret 1 is a charging substance that retains positive or negative charges on the surface and provides an electrostatic field to the surroundings, and the surface potential is expressed by the electret layer 2 in which the thin film of the inorganic dielectric material is polarized. The electret 1 is used, for example, as an integrated circuit built-in power generation element in various devices that mutually convert mechanical energy and electrical energy, for example, in a small electrostatic vibration power generation device that uses environmental vibration as a power source.

The electret 1 has any outer shape according to the shape of the substrate 10 (for example, a rectangular flat plate shape or a disk shape), and the electret layer 2 is laminated and formed above one surface of the substrate 10. Here, the vertical direction in the drawing is defined as a thickness direction X of the substrate 10, the surface above which the electret layer 2 is laminated is referred to as an upper surface, and the surface on the opposite side is referred to as a lower surface.

Since the dielectric breakdown voltage is increased by using an inorganic dielectric material having a relatively large handclap energy of 4 eV or more, the electret layer 2 can express a desired high potential by being applied with a high voltage during the polarization treatment. It is more preferable to use an inorganic dielectric material having a bandgap energy of 4.5 eV or more, more preferably 5.5 eV or more.

Preferably, the inorganic dielectric material constituting the electret layer 2 contains two different metal elements A and B, and the basic composition is a composite oxide represented by the composition formula $ABO_3$. The oxygen content may be lower than the basic composition due to defects formed in the structure, and in that case, the inorganic dielectric material can be represented by the composition formula $ABO_x$ ($x \leq 3$). Preferably, when the amount of oxygen is smaller than the stoichiometric ratio of the basic composition, defects are likely to be introduced and the surface potential is likely to increase.

The form of the thin film constituting the electret layer 2 is not particularly limited, and may be, for example, a film of the composite oxide having an amorphous structure (hereinafter referred to as an amorphous film) or a film containing a crystal of the composite oxide (hereinafter referred to as an oxide crystal film). The crystal of the composite oxide represented by the composition formula $ABO_3$ has a perovskite structure described later.

In the present embodiment, an electret layer 2 using an amorphous film will be mainly described below. In the amorphous film, defects due to dangling bonds in a non-bonded state are likely to be formed compared with an oxide crystal film having a perovskite structure of the same composition. In the electret layer 2, it is considered that the presence of defects is important for the expression of the surface potential, and a high surface potential can be obtained by using the amorphous film. Further, since the amorphous film can be formed at a lower temperature than the oxide crystal film, it is possible to suppress thermal damage to wiring and the like during a device formation.

As a specific example, in the composite oxide represented by the composition formula $ABO_3$, the metal element A (A site) can be a rare earth element R selected from the group consisting of La, Y, Sc, Pr, Sm and Nd, and the metal element B (B site) can be Al. Since a composite oxide ($RAlO_3$; rare earth aluminate) in which a trivalent rare earth element R and a trivalent Al are combined has a large bandgap energy of 4 eV or more and a relatively small relative permittivity (for example, 100 or less), a high surface potential can be realized. In addition, the rare earth aluminate can be manufactured using a relatively inexpensive material, which is advantageous in terms of manufacturing cost.

In the composition formula $ABO_3$, a part of the metal element A at the A site, a part of the metal element B at the B site, or both of them may be substituted with a dopant element composed of different metal elements. In that case, if the dopant element is a metal element having a lower valence than the metal elements A and B, defects due to oxygen vacancies are likely to occur in the structure. For example, when the metal element A is a trivalent rare earth element R, a divalent alkaline earth metal element is preferably used, and when the metal element B is a trivalent Al, one or more elements selected from the group consisting of alkaline earth metal elements and Zn are preferably used. Here, the alkaline earth metal elements include Mg.

By adopting a composition in which a part of the metal elements A and B constituting the composite oxide is substituted in this way, it becomes easy to introduce oxygen defects. The substitution ratio of the dopant element to the metal elements A and B can be appropriately set in the range of, for example, 20 atomic % or less, and a desired high surface potential according to the substitution ratio can be obtained. In this way, defects can be generated by introducing the dopant element, and by controlling the substitution ratios of the metal elements A and B, the amount of defects can be controlled and stable surface potential characteristics can be obtained. Preferably, when the substitution ratio is 0.05 atomic % or more, the surface potential is greatly improved. However, when the substitution ratio increases, the effect of introducing the dopant element tends to decrease. Therefore, it is preferable to appropriately set the substitution ratio within the range where the substitution ratio does not exceed 20 atomic % so that the desired characteristics can be obtained. The substitution ratio is preferably in the range of 0.05 atomic % to 18.8 atomic %, and more preferably in the range of 0.05 atomic % to 2.5 atomic %.

The electret layer 2 is mainly composed of the inorganic dielectric material made of such a composite oxide and is formed into a thin film above the substrate 10 by any film forming method. Examples of the film forming method include a physical vapor deposition method (PVD method) such as a sputtering method, a chemical vapor deposition method (CVD method), a welding method, and a sol-gel method, and may be adopted in consideration of film quality and film thickness to be formed.

For example, when the sputtering method is used, an inorganic dielectric material having a desired composition to be the electret layer 2 is used as target, accelerated ions are made to collide by application of a high voltage in an inert gas to form a thin film above the substrate 10. At this time, the inorganic dielectric material as the target can be a composite oxide crystal having a perovskite structure of the same composition as the amorphous film to be the electret layer 2.

The film formation temperature is usually in the range of room temperature to 1000° C. and may be a temperature according to the material. By forming the film under a temperature condition of 1000° C. or lower using such a method, it is possible to form the thin film to be the electret layer 2 while suppressing damage to the substrate 10 and wiring on the substrate 10 due to high temperature. As the inorganic dielectric material used as the target raw material, a material produced by a high temperature process exceeding 1000° C. can be used.

The material of the substrate 10 is not particularly limited. In the present embodiment, for example, a conductive Si substrate is used. In addition, a conductive substrate using a conductive material such as metal or an insulating substrate using a glass material or the like can also be used.

The electret layer 2 formed above the substrate 10 can have any film thickness by adjusting the film forming conditions and the like. Preferably, for example, by forming the thin film in the range of 0.01 μm to 100 μm, the electret 1 suitable for a small device such as a vibration power generation element or a memory circuit can be obtained.

It is preferable to arrange a conductive layer 3 in contact with at least one surface of the electret layer 2 in the thickness direction X. The conductive layer 3 is made of a conductive film formed by using a conductive metal such as Ti, Au, and Pt, and may have a structure in which a plurality of conductive films are laminated. By using the conductive layer 3 as an electrode during the polarization treatment, the thin film arranged in contact with the conductive layer 3 can be easily polarized and formed into the electret layer 2.

In the electret 1 shown in FIG. 1, the conductive layer 3 is formed above the upper surface of the substrate 10 made of conductive Si, and the electret layer 2 is formed in contact with an upper surface of the conductive layer 3. The conductive layer 3 has a two-layer structure, a first conductive layer 31 is formed close to the substrate 10, and a second conductive layer 32 is formed on an upper surface of the first conductive layer 31. The first conductive layer 31 is made of a metal such as Ti having good adhesion to the second conductive layer 32 and a thermal oxide film 11, and the second conductive layer 32 is made of a noble metal having good conductivity (for example, Pt, Au, etc.). The first conductive layer 31 is arranged in contact with the thermal oxide film 11 formed on the upper surface of the substrate 10, and the second conductive layer 32 is arranged in contact with the lower surface of the electret layer 2. Here, an example in which a Ti film as the first conductive layer 31 and a Pt film as the second conductive layer 32 are combined is shown.

The electret 1 is obtained by performing a polarization treatment in a state where the conductive layer 3 and the thin film to be the electret layer 2 are formed above the substrate 10. A method of the polarization treatment is not particularly limited. For example, the polarization treatment is performed by a corona discharge or the like by applying a voltage between a ground electrode connected to the conductive layer 3 and a counter electrode. As for the polarization treatment conditions, for example, it is desirable to apply a voltage at a temperature of 100° C. or higher so that the electric field strength becomes 1 kV/mm or higher, preferably 4 kV/mm or higher.

Therefore, it is desirable that the electret layer 2 has a dielectric breakdown electric field strength (for example, 1 kV/mm or more, preferably 4 kV/mm or more) higher than the electric field strength during the polarization treatment. In order to realize efficient power generation as a device, for example, for vibration power generation, a surface potential of 400 V or more is required. For example, in the case of an electret layer 2 having a film thickness of 100 μm, a desired surface potential can be achieved by a polarization treatment with an electric field strength of 4 kV/mm or more.

Here, since the surface potential of the electret layer 2 after the polarization treatment is proportional to a voltage applied to the composite film formed above the substrate 10, it is necessary to apply a voltage capable of realizing the surface potential required according to the application. Alternatively, the film thickness may be increased according to the required voltage so that dielectric breakdown does not occur.

Example 1

The electret 1 having the configuration shown in FIG. 1 was produced by the following method.

<Film Formation>

First, the upper surface of the substrate 10 made of conductive Si was thermally oxidized to form the thermal oxide film 11 having a film thickness of 50 nm, and then the conductive layer 3 was formed on the upper surface of the thermal oxide film 11 by a sputtering method. The conductive layer 3 was formed by forming a Ti film of 30 nm as the first conductive layer 31 and a Pt film of 100 nm as the second conductive layer 32 in order from the side in contact with the thermal oxide film 11, using metal materials forming respective layers as targets at 300° C. in an Ar atmosphere.

Further, the thin film of the composite oxide to be the electret layer 2 was formed on the upper surface of the second conductive layer 32 by a sputtering method. The sputtering conditions were 300° C. and an Ar atmosphere, and an amorphous film to be the electret layer 2 was formed with a film thickness of 0.7 μm, using lanthanum aluminate ($LaAlO_3$), which is an oxide crystal having a perovskite structure, as a target.

The amorphous film formed in this way is a composite oxide containing La and Al as two metal elements A and B (composition formula $ABO_x$; in the formula, $x \leq 3$), and is an amorphous film containing La, Al and O with a ratio of about 1:1:3. At this time, the ratio of La:Al:O in the amorphous film is almost the same as the stoichiometric ratio composition of $LaAlO_3$ used as the target, or the oxygen content ratio is smaller than the stoichiometric ratio.

<Polarization Treatment>

The amorphous film to be the electret layer 2 was formed above the substrate 10 in this way and was subjected to a polarization treatment to obtain the electret 1. A corona discharge is used for the polarization treatment, the conductive layer 3 in contact with the lower surface of the amorphous film is grounded to be a ground electrode, and a corona discharge electrode is arranged opposite to each other on the upper surface of the amorphous film, and a negative voltage is applied to perform the corona discharge. The conditions for the corona discharge were as follows. The voltage was applied and the corona discharge was continued even when the temperature was lowered.

Discharge voltage: −6 kV
Temperature: 200° C.
Processing time: 1 hour

As a result, the amorphous film containing La, Al, and O formed above the substrate 10 was polarized and became negatively charged on the upper surface side, so that the electret layer 2 having electret performance was formed. At this time, a high surface potential corresponding to the polarization treatment conditions can be obtained, and by performing the polarization treatment at a temperature higher than room temperature (for example, 200° C.), the fluctuation of the surface potential can be easily restricted even in applications where the usage environment is at high temperatures, and stable electret performance can be realized.

The temperature and other conditions of the polarization treatment can be appropriately changed according to the characteristics required in the assumed usage environment.

In the electret 1 obtained as described above, the bandgap energy of the composite oxide containing La, Al, and O to be the electret layer 2 was 6.2 eV, and the surface potential of the polarized electret layer 2 was −470V.

As a result of observing a charged state of the obtained electret 1, it was found that, unlike the conventional electret, an electric charge was generated on the surface of the material to be the electret layer 2 due to the polarization, the electric charge could be taken out as electric power, and the surface potential once lowered was recovered with time and the electric charge could be taken out as electric power repeatedly. The reason is not entirely clear, but it is presumed that the charged state is different from a state where an electric charge is introduced from a surface and is held inside as in the conventional electret.

Figure 2:
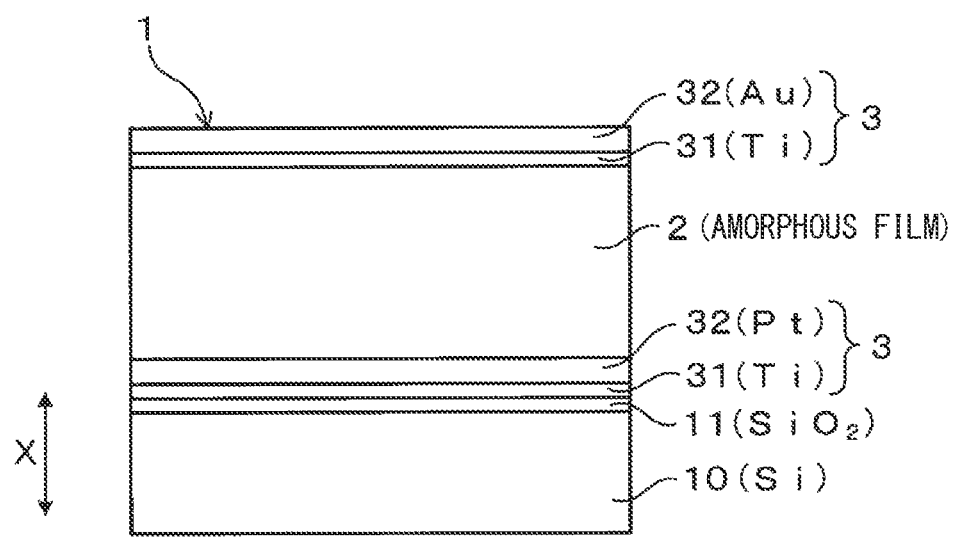
FIG. 2 is a schematic view showing another schematic configuration of an electret including a plurality of conductive layers.

As shown in FIG. 2, the conductive layer 3 may be arranged in contact with both surfaces of the electret layer 2 in the thickness direction X, and the polarization treatment may be performed using a direct-current power supply or the like. In that case, in the electret 1 having the configuration of FIG. 1, a conductive layer 3 may be further formed on the upper surface of the electret layer 2 by a sputtering method, and the electret layer 2 may be arranged between the two conductive layers 3. Also in this case, the conductive layer 3 formed on the upper surface can have a two-layer structure. FIG. 2 shows an example in which a first conductive layer 31 (for example, a Ti film of 30 nm) is formed adjacent to the electret layer 2, and a second conductive layer 32 (for example, an Au film of 200 nm) is formed on an upper surface of the first conductive layer 31.

The polarization treatment is performed by connecting a direct-current power supply or the like to the conductive layer 3 on the upper surface of the electret layer 2, grounding the conductive layer 3 on the lower surface, and applying a predetermined voltage. In this way, although the number of steps for forming the plurality of conductive layers 3 is increased, the voltage applied to the amorphous film for electretization can be accurately controlled, so that there is an advantage that more stable characteristics can be obtained.

Second Embodiment

Figure 3:
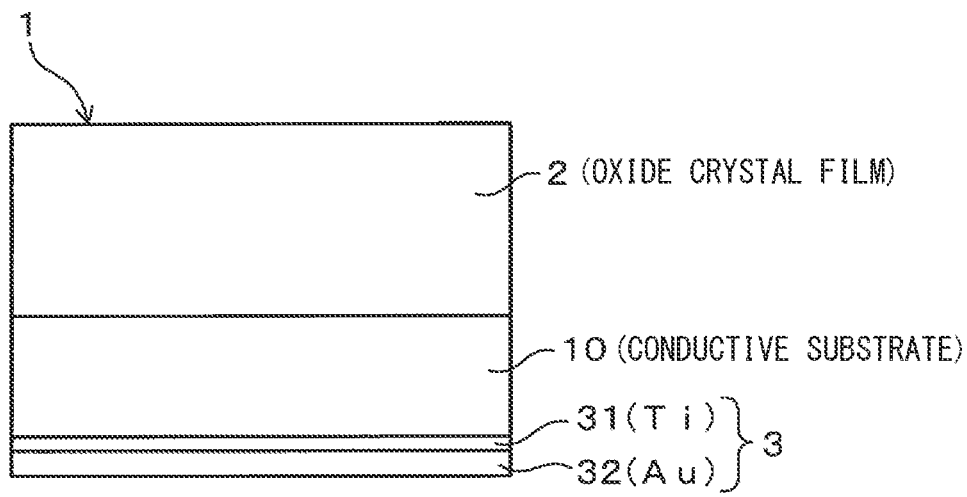
FIG. 3 is a schematic view showing a schematic configuration example of an electret according to a second embodiment.

An electret according to a second embodiment will be described with reference to FIGS. 3 to 5. As shown in FIG. 3, the basic configuration of the electret 1 of the present embodiment is the same as that of the first embodiment, and includes a substrate 10 and an electret layer 2 formed above a surface of the substrate 10. In the present embodiment, the structure of the material of the substrate 10 and the structure of the inorganic dielectric material to be the electret layer 2 and the arrangement of the conductive layer 3 are different. Hereinafter, the differences will be mainly described.

Incidentally, among reference numerals used in the second and subsequent embodiments, the same reference numerals as those used in the embodiment already described represent the same components as those in the embodiment already described, unless otherwise indicated.

Also in the present embodiment, the electret layer 2 is a composite metal compound containing two or more metal elements and is formed by subjecting a thin film mainly composed of an inorganic dielectric material having a bandgap energy of 4 eV or more to a polarization treatment. The inorganic dielectric material has a basic composition of a composite oxide represented by a composition formula $ABO_3$ and may be a composition having a low oxygen content (for example, the composition formula $ABOx$ (in the formula, x≤3). Preferably, the metal element A is a rare earth element R selected from the group consisting of La, Y, Sc, Pr, Sm and Nd, and the metal element B is Al.

In the first embodiment, the thin film forming the electret layer 2 is the amorphous film made of the amorphous composite oxide, but in the present embodiment, the thin film is a polycrystalline film containing a crystal of the composite oxide. That is, the polycrystal film is composed of an aggregate of composite oxide crystals having an $ABO_3$ type perovskite structure, and a part of a metal element that occupies the A site, a part of the metal element B that occupies the B site, or both of them are substituted with dopant elements composed of different metal elements.

Also in this case, by setting the dopant element to a metal element having a lower valence than the metal elements A and B, the A site or the B site of the perovskite structure is substituted, and oxygen defects can be easily introduced into the structure. For example, when the metal element A is a trivalent rare earth element R, a divalent alkaline earth metal element (including Mg) is preferably used, and when the metal element B is a trivalent Al, one or more elements selected from the group consisting of divalent alkaline earth metal elements (including Mg) and Zn are preferably used.

The substitution ratio of the dopant element that substitutes for the metal element A can be appropriately set in the range of, for example, 20 atomic % or less. Similarly, it is preferable that the substitution ratio of the dopant element that substitutes for the metal element B is appropriately set in the range of, for example, 20 atomic % or less. By controlling these substitution amounts, oxygen defects can be generated and stable characteristics can be obtained. Preferably, the substitution ratio is in the range of 0.05 atomic % to 18.8 atomic %, and more preferably in the range of 0.05 atomic % to 2.5 atomic %.

The electret layer 2 is mainly composed of the inorganic dielectric material made of such a composite oxide and is formed into the thin film above the substrate 10 by any film forming method. For example, in a case where a sputtering method is used as the film forming method, a similar method can be used except that the film forming temperature condition is set to be equal to or higher than the crystallization temperature of the inorganic dielectric material, and controlled to be a temperature (for example, about 500° C. to 1000° C. or lower) higher than a temperature (for example, about room temperature to 500° C.) for forming the amorphous film.

In the present embodiment, a conductive substrate made of SrTiO containing Nb is used as the substrate 10. In this case, unlike the Si substrate, the thermal oxide film 11 on the surface is not formed, so that the polarization treatment can be performed via the conductive substrate 10. Therefore, as the conductive layer 3 made of a conductive film, a first conductive layer 31 made of a Ti film and a second conductive layer 32 made of an Au film are formed in this order from the side in contact with the lower surface of the substrate 10. With this configuration, the conductive layer 3 can be easily grounded.

Example 2

The electret 1 having the configuration shown in FIG. 3 was produced by the following method.
<Film Formation>
First, as the substrate 10, a conductive substrate made of SrTiO$_3$ containing 0.5% by mass of Nb was prepared, and a thin film of a composite oxide to be the electret layer 2 was formed on an upper surface of the substrate 10 by a sputtering method. The sputtering conditions were 800° C. and an Ar atmosphere, and the thin film to be the electret layer 2 was formed to have a thickness of 0.7 μm by using a sintered body having a composition of lanthanum aluminate (LaAlO$_3$), which is an oxide crystal having a perovskite structure, as a target.

The obtained thin film was a polycrystalline film having a composition of LaAlOx (x<3). Further, the conductive layer 3 was formed on the lower surface of the substrate 10 by a sputtering method. When forming the conductive layer 3, the Ti film of 30 nm to be the first conductive layer 31 and the Au film of 200 nm to be the second conductive layer 32 were formed in order from the side close to the substrate 10, using the metal materials forming respective layers as targets at 300° C. in the Ar atmosphere.

<Polarization Treatment>
The polycrystalline film to be the electret layer 2 was formed on the substrate 10 as described above and subjected to a polarization treatment to obtain the electret 1. A corona discharge is used for the polarization treatment, the conductive layer 3 on the lower surface of the substrate 10 is grounded to be a ground electrode, and a negative voltage is applied between the conductive layer 3 on the lower surface of the substrate 10 and a corona discharge electrode arranged on the upper surface of the electret layer 2 to cause the corona discharge. The conditions for the corona discharge were as follows. The voltage was applied and the corona discharge was continued even when the temperature was lowered.
Discharge voltage: −6 kV
Temperature: 200° C.
Processing time: 1 hour Even in this way, similarly to Example 1, the polycrystalline film having the LaAlOx composition and formed on the substrate 10 was polarized and became negatively charged on the upper surface side, so that the electretized electret layer 2 was formed. Also in this case, a high surface potential depending on the polarization treatment conditions can be obtained, and stable electret performance can be realized.

Figure 4:
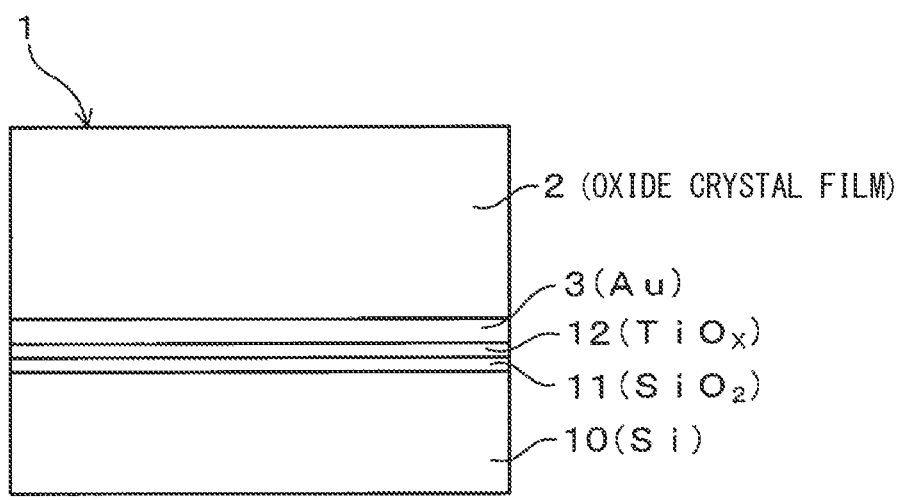
FIG. 4 is a schematic view showing another schematic configuration example of an electret according to the second embodiment in which a configuration and arrangement of a substrate is changed.

Here, as shown in FIG. 4, a polycrystalline film having a composition of LaAlOx (x<3) can also be used as the electret layer 2 in the configuration using the substrate 10 made of conductive Si, as in FIG. 1 (Example 1) of the first embodiment. In that case, a thermal oxide film 11 having a film thickness of 50 nm is formed on the upper surface of the substrate 10, and a TiOx film 12 having a film thickness of 30 nm and an Au film to be the conductive layer 3 having a film thickness of 100 nm are formed on an upper surface of the thermal oxide film 11 by a sputtering method. Next, the polycrystalline film to be the electret layer 2 is formed with a predetermined film thickness by a sputtering method, using a sintered body having a composition of lanthanum aluminate (LaAlO$_3$) as a target.

The obtained polycrystalline film can be subjected to a polarization treatment by a corona discharge with the Au film to be the conductive layer 3 grounded in the same manner as in Example 1 above. Even in this way, similarly to Examples 1 and 2, the polycrystalline film having the LaAlOx composition and formed above the substrate 10 is polarized and is negatively charged on the upper surface side, thereby forming the electretized electret layer 2.

Example 3

Figure 5:
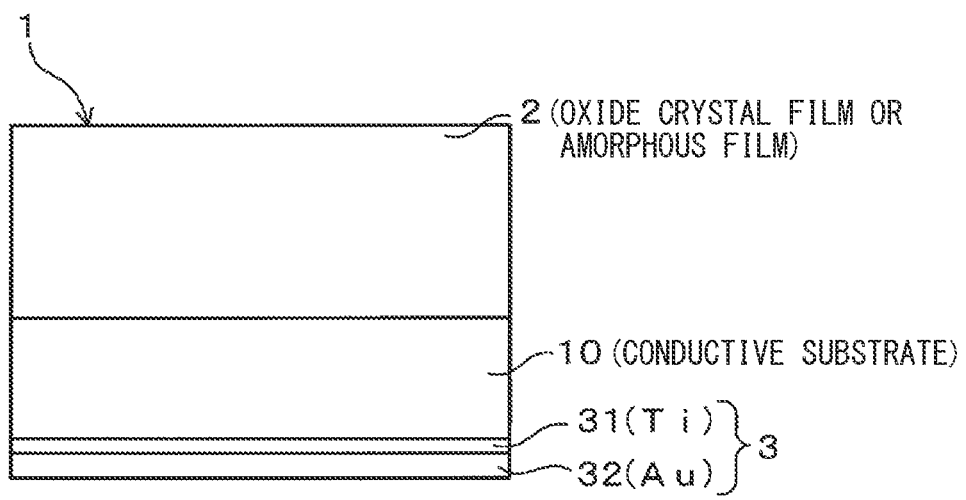
FIG. 5 is a schematic view showing another schematic configuration example of an electret according to the second embodiment in which a configuration of a substrate is changed.

As shown in FIG. 5, in the same substrate configuration as in Example 2, a polycrystalline film in which a dopant element is introduced into the composition of LaAlOx (x<3) can also be used as the electret layer 2. An electret 1 having this configuration was produced by the following method.
<Film Formation>
First, as the substrate 10, a conductive substrate made of SrTiO$_3$ containing 0.5% by mass of Nb was prepared, and a thin film of a composite oxide to be the electret layer 2 was formed on an upper surface of the substrate 10 by a sputtering method. The sputtering conditions were 800° C. and an Ar atmosphere, and a thin film to be the electret layer 2 was formed with a film thickness of 0.7 μm, using a sintered body of a lanthanum aluminate-based composite oxide as a target. Here, the lanthanum aluminate-based composite oxide was a sintered body having a composition of La$_{0.99}$Ca$_{0.01}$Al$_{3-y}$.

The obtained thin film was a polycrystalline film having a composition of La$_{0.99}$Ca$_{0.01}$AlO$_{3-y}$ (y<0.2). Further, a conductive layer 3 was formed on the lower surface of the substrate 10 by a sputtering method. When forming the conductive layer 3, a Ti film of 30 nm to be a first conductive layer 31 and an Au film of 200 nm to be a second conductive layer 32 were formed in order from the side close to the substrate 10, using the metal materials forming respective layers as targets at 300° C. in the Ar atmosphere.

<Polarization Treatment>
In this way, the polycrystalline film to be the electret layer 2 was formed on the substrate 10 and subjected to the same polarization treatment as in Example 2 to obtain the electret 1. As a result, the polycrystalline film having the composition of La$_{0.99}$Ca$_{0.01}$AlO$_{3-y}$ and formed on the substrate 10 was polarized and became negatively charged on the upper surface side, so that the electretized electret layer 2 was formed. Also in this case, a high surface potential depending on the polarization treatment conditions can be obtained, and stable electret performance can be realized. By changing the temperature condition at the time of film formation, an amorphous film can be formed as in Example 1 above.

In the electrets 1 of Examples 2 and 3, lanthanum aluminate (LaAlO$_3$), which is a typical composition of the LAO-based inorganic dielectric material constituting the electret layer 2, had a bandgap energy of 5.6 eV. (La$_{0.99}$Ca$_{0.01}$AlOx) in which a part of La was substituted with Ca, which was a dopant element, also had almost the same bandgap energy, and the bandgap energy of (La$_{1-y}$Ca$_y$AlO$_{3-δ}$) in which the substitution ratio y of Ca was changed in the range of 20 atomic % or less was also almost the same. Further, it was confirmed that a surface potential of (La$_{1-y}$Ca$_y$AlO$_{3-δ}$) when a polycrystal having a thickness of 1 mm was prepared by a liquid phase method was 438 V to 3688V (an electric field strength during polarization due to application of a direct-current electric field was 1 kW/mm or more) when the substitution ratio was changed in the range of 0.05 atomic % to 0.93 atomic %, and a desired surface potential (for example, 400 V ore more) can be obtained by appropriately selecting the applied voltage and the film thickness as described above.

For other rare earth aluminates, the bandgap energies in typical compositions are shown below. Even when a part of metal elements of these rare earth aluminates are substituted, they have almost the same bandgap energy. Among them, it was confirmed that a surface potential of $YAlO_3$ when a polycrystal having a thickness of 1 mm was prepared by a solid phase method was −160V to −1155V (an electric field strength during polarization due to a corona discharge was 1 kV/mm or more) when the substitution ratio was changed in the range of 0.05 atomic % to 18.8 atomic %, and a high surface potential of about 1000 V was obtained in the range of the substitution ratio of 0.05 atomic % to 2.5 atomic %.

$YAlO_3$: 7.9 eV
$ScAlO_3$: 4.6 eV
$PrAlO_3$: 4.7 eV
$SmAlO_3$: 4.6 eV
$NdAlO_3$: 4.4 eV

On the other hand, $BaTiO_3$ (bandgap energy: 3.5 eV) having a perovskite structure had a surface potential of 4 V (electric field strength at the time of polarization of 1 kV/mm or more) when formed into a polycrystal having a thickness of 1 mm. By comparing these surface potentials, it is found that the electret performance of the electret 1 in which the electret layer 2 is formed above the substrate 10 can be improved by using a thin film of a composite oxide having a bandgap energy of 4 eV or more, such as rare earth aluminate.

In this way, the electret 1 that includes the thin-film electret layer 2 exhibiting stable characteristics can be formed without using a high temperature process exceeding 1000° C.

The present disclosure is not limited to the embodiments described above, and various modifications may be adopted within the scope of the present disclosure without departing from the spirit of the disclosure.

What is claimed is:

1. An electret comprising a substrate and an electret layer formed above a surface of the substrate, wherein
the electret is a composite metal compound containing two or more different metal elements and is obtained by subjecting a thin film mainly composed of an inorganic dielectric material having a bandgap energy of 4 eV or more to a polarization treatment.

2. The electret according to claim 1, wherein
the inorganic dielectric material includes two different metal elements A and B and has a basic composition of a composite oxide represented by a composition formula of $ABO_3$, and
the thin film is a film containing the composite oxide having an amorphous structure or a film containing a crystal of the composite oxide having a perovskite structure.

3. The electret according to claim 2, wherein
the metal element A is a rare earth element R selected from the group consisting of La, Y, Pr, Sm and Nd, and
the metal element B is Al.

4. The electret according to claim 3, wherein
in the composite oxide, at least one of the metal elements A and B is partially substituted with a dopant element composed of a different metal element,
the dopant element that substitutes for the metal element A is an alkaline earth metal, and
the dopant element that substitutes for the metal element B is one or more elements selected from the group consisting of alkaline earth metal elements and Zn.

5. The electret according to claim 4, wherein
a substitution ratio of the dopant element that substitutes for the metal element A is 20 atomic % or less, and
the substitution ratio of the dopant element that substitutes for the metal element B is 20 atomic % or less.

6. The electret according to claim 4, wherein
a substitution ratio of the dopant element that substitutes for the metal element A is 0.05 atomic % to 18.8 atomic %, and
a substitution ratio of the dopant element that substitutes for the metal element B is 0.05 atomic % to 18.8 atomic %.

7. The electret according to claim 4, wherein
a substitution ratio of the dopant element that substitutes for the metal element A is 0.05 atomic % to 2.5 atomic %, and
a substitution ratio of the dopant element that substitutes for the metal element B is 0.05 atomic % to 2.5 atomic %.

8. The electret according to claim 1, further comprising
a conductive layer made of a conductive film and be in contact with at least one surface of the electret layer in a thickness direction of the substrate, wherein
the electret layer is a thin film having a film thickness in a range of 0.01 μm to 100 μm.

9. The electret according to claim 1, wherein
the electret layer has a dielectric breakdown electric field strength higher than an electric field strength during the polarization treatment.

* * * * *